United States Patent [19]

Mohri et al.

[11] Patent Number: 5,576,123
[45] Date of Patent: Nov. 19, 1996

[54] OVERLYING SHIFTER TYPE PHASE SHIFT PHOTOMASK BLANK, OVERLYING SHIFTER TYPE PHASE SHIFT PHOTOMASK AND METHODS OF PRODUCING THEM

[75] Inventors: Hiroshi Mohri; Hiroyuki Miyashita, both of Tokyo, Japan

[73] Assignee: Dai Nippon Printing Co., Ltd., Tokyo, Japan

[21] Appl. No.: 405,807

[22] Filed: Mar. 16, 1995

[30] Foreign Application Priority Data

Mar. 16, 1994 [JP] Japan ................................ 6-070255

[51] Int. Cl.⁶ ................................................ G03F 9/00
[52] U.S. Cl. ........................... 430/5; 430/313; 430/322; 430/394
[58] Field of Search ............................... 430/5, 311, 313, 430/322, 394

[56] References Cited

U.S. PATENT DOCUMENTS 5,194,344 3/1993 Cathey, Jr. et al. ...................... 430/5
5,380,608 1/1995 Miyoshita et al. ........................ 430/5

Primary Examiner—S. Rosasco
Attorney, Agent, or Firm—Sughrue, Mion, Zinn, Macpeak & Seas

[57] ABSTRACT

An overlying shifter type phase shift photomask used to produce semiconductor integrated circuits of high integration density, e.g. VLSI, ULSI, etc., which is capable of transferring fine-line patterns to a wafer by projection exposure. The photomask is produced by forming at least a light-blocking layer pattern or a combination of a light-blocking layer pattern and an etching stopper layer for a shifter layer on a transparent substrate, forming a shifter layer over the whole surface of the substrate, and then patterning the shifter layer to form a shifter layer pattern. The production method includes the step of polishing away unevenness on the surface of the shifter layer caused by a step which is produced by the light-blocking layer pattern, thereby leveling the surface of the shifter layer.

18 Claims, 6 Drawing Sheets

FIG. 5(a)
PRIOR ART
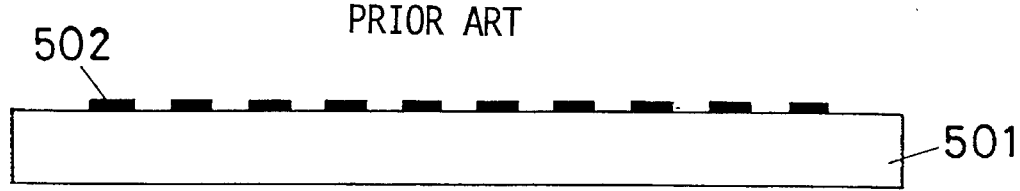
FIG. 5(b)
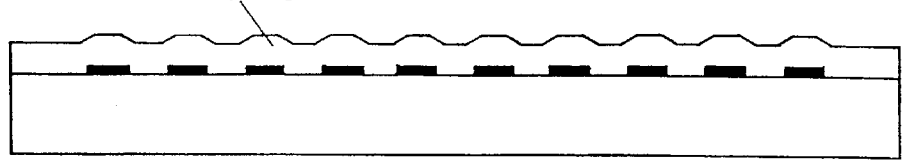
FIG. 5(c)
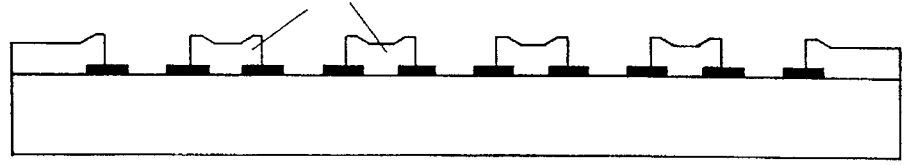
FIG.6(a)  FIG.6(b)  FIG.6(c)
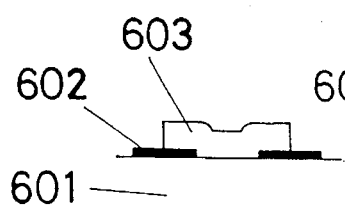 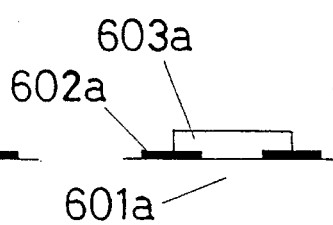 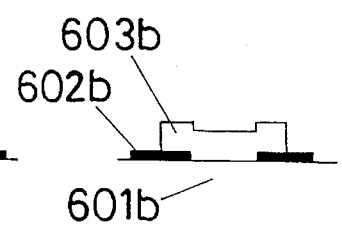

OVERLYING SHIFTER TYPE PHASE SHIFT PHOTOMASK BLANK, OVERLYING SHIFTER TYPE PHASE SHIFT PHOTOMASK AND METHODS OF PRODUCING THEM

BACKGROUND OF THE INVENTION

The present invention relates to photomasks which are used to produce integrated circuits of high integration density, e.g., large-scale integrated circuits (LSI), very large-scale integrated circuits (VLSI), ultra large-scale integrated circuits (ULSI), etc. More particularly, the present invention relates to an overlying shifter type phase shift photomask which is used to form fine-line patterns on a wafer at high density by projection exposure. The present invention also relates to a blank which is used to produce such an overlying shifter type phase shift photomask.

With the achievement of high integration density of semiconductor integrated circuits, reticles which are used to produce integrated circuits of high integration density have also been required to further reduce line width At present, the line width of device patterns transferred from 5×reticles for 16M-bit DRAMs is as fine as 0.6 μm. In the case of the device patterns of 64M-bit DRAMs, line width resolution of 0.35 μm is required. Accordingly, the demanded device patterns cannot be realized by the conventional photolithographic method that employs a stepper because of the pattern resolution limit of this method. Under these circumstances, attention has been given to a phase shift photomask which enables an improvement in resolution of device patterns transferred from a reticle in a photolithography process and which can be used with the existing stepper.

The basic idea and principle of the phase shift photomask have already been disclosed, for example, in Japanese Patent Application Laid-Open (KOKAI) No. 58-17344 and Japanese Patent Application Post-Exam Publication No. 62-59296. Recently, the merit of the phase shift photomask constructed from the existing photolithographic system has been recognized anew, and various types of phase shift photomask have been actively developed. One of them is an overlying shifter type phase shift photomask, which has a shifter layer pattern that overlies at least a light-blocking layer pattern formed on a transparent substrate.

Resolution obtained when projection exposure is carried out on a wafer by using the overlying shifter type phase shift photomask will be briefly explained below with reference to FIGS. 7(A) and 7(B) in comparison to a projection exposure process that uses a conventional photomask with no shifter layer.

Part (a) of FIG. 7(A) shows the way in which projection exposure is carried out by using an overlying shifter type phase shift photomask 701. Part (b) of FIG. 7(A) shows the amplitude of light at the exit side of the photomask 701 when projection exposure is carried out as shown in part (a). Part (c) of FIG. 7(A) shows the light amplitude distribution on the wafer. Part (d) of FIG. 7(A) shows the light intensity distribution on the wafer.

Part (a) of FIG. 7(B) shows the way in which projection exposure is carried out by using a conventional photomask 701a. Part (b) of FIG. 7(B) shows the amplitude of light at the exit side of the photomask 701a when projection exposure is carried out as shown in part (a). Part (c) of FIG. 7(B) shows the light amplitude distribution on the wafer. Part (d) of FIG. 7(B) shows the light intensity distribution on the wafer.

The overlying shifter type phase shift photomask 701, which is shown in part (a) of FIG. 7(A), has a transparent substrate 702. Line & space patterns of light-blocking films 703 are formed with a predetermined width and at a predetermined pitch on the transparent substrate 702. A shifter layer 704 is disposed so as to lie over every other opening in the line & space patterns and upon the light-blocking films 703 which are adjacent to the opening. The conventional photomask 701a, which is shown in part (a) of FIG. 7(B), has a transparent substrate 702a on which line & space patterns of light-blocking films 703a are disposed with a predetermined width and at a predetermined pitch.

When exposure light is incident on the overlying shifter type phase shift photomask 701, at the exit side of the photomask 701, the amplitude of light passing through the shifter regions 704 is mπ (m is an odd integer) shifted in phase with respect to the amplitude of light passing through the openings defined between the light-blocking films 703 where no shifter is present, as shown in part (b) of FIG. 7(A), thereby effecting phase inversion. Accordingly, the light passing through the shifter regions 704 and the light passing through the openings interfere with each other on the wafer, producing an amplitude distribution such as that shown in part (c) of FIG. 7(A). As a result, the light intensity on the wafer has a distribution such as that shown in part (d) of FIG. 7(A).

In contrast to the above, when the conventional photomask 701a is used, at the exit side of the photomask 701a, there is no phase shift between the amplitudes of light rays passing through the openings, as shown in part (b) of FIG. 7(B). These transmitted light rays interfere with each other, producing an amplitude distribution such as that shown in part (c) of FIG. 7(B). As a result, the light intensity on the wafer has a distribution such as that shown in part (d) of FIG. 7(B).

It will be understood from FIGS. 7(A) and 7(B) that in the case of part (d) of FIG. 7(A), the light intensity is zero at a region between each pair of adjacent crests of the light intensity distribution curve, whereas, in the case of part (d) of FIG. 7(B), the light intensity distribution curve shows an undesirably gentle slope and has no region where the light intensity is zero. With respect to forming the resist pattern resolution on the wafer, the light intensity distribution shown in part (d) of FIG. 7(A) is superior to the light intensity distribution shown in part (d) of FIG. 7 (B).

It is ideal to set the thickness of the shifter regions 704 so that the phase difference is mπ (m is an odd integer). With the phase difference of mπ, the most favorable phase shift effect can be obtained, and in the range of from mπ−π/3 to mπ+π/3 (m is an odd integer), resolution can be effectively improved.

It is necessary in order to obtain high resolution to control the phase shift quantity of exposure light at the shifter so that exposure light passing through the openings covered with the shifter is inverted in phase with respect to exposure light passing through the openings where no shifter is present, as has been described above. The phase shift quantity is φ [radian] which is expressed by $$\phi = 2\pi(n-1)d/\lambda \quad (1)$$

where n is the refractive index for the exposure light wavelength of a material used to form the shifter (phase shift layer), d is the thickness of the phase shift film, and λ is the wavelength of exposure light.

The film thickness of the shifter (phase shift layer) is determined by the wavelength of exposure light and the refractive index of the shifter material (phase shift layer material), and the control of film thickness of the shifter (phase shift layer) is important in controlling the phase angle.

Assuming that the exposure light is the i-line (365 nm), and the shifter material is silicon dioxide, since the refractive index of the shifter material (silicon dioxide) is about 1.5, the film thickness required to shift the phase by 180 degrees is nearly 400 nm. It should be noted that silicon dioxide exhibits a refractive index of the order of 1.5 regardless of the film formation method employed.

In general, the light-blocking film is formed from a chromium film. In many cases, the light-blocking film has a triple-layer structure in which anti-reflection films are provided on both sides of a chromium film. The light-blocking film needs a film thickness of the order of 100 nm in order to obtain sufficient light-blocking effect.

In the case of 5×reticles used for 64M-bit DRAMs, the pattern size is about from 1.0 µm to 1.5 µm.

Thus, in the case of an overlying shifter type phase shift photomask, a phase shift film of 400 nm in thickness is formed on light-blocking film patterns having a thickness of 100 nm. Therefore, in a conventional manufacturing process shown in FIG. 5, the surface of the shifter (phase shift layer) is affected by the unevenness of the underlying light-blocking film patterns, and the resulting shifter has a cross-sectional configuration such as that shown in FIG. 6(a). Consequently, the phase is disordered within a light-transmitting region, making it impossible to control the phase angle accurately.

The influence on the phase shift angle largely varies according to the pattern spacing, the method of forming the phase shift film, and film forming conditions. This is also a problem to be solved.

An ideal shifter cross-sectional configuration for suppressing the phase disorder is such as that shown in FIG. 6(b) or 6(c).

To improve the cross-sectional configuration of the shifter regions, the shifter layer should be formed flat on the light-blocking film. Based on this idea, the use of a spin-on-glass (SOG) film as a leveling film has been proposed, as disclosed in Japanese Patent Application Laid-Open (KOKAI) No. 05-297569.

With the proposed method, however, it is exceedingly difficult to form a leveling film of SOG on a light-blocking layer having recesses and projections, which have a width of 1.0 µm to 1.5 m and a height of about 100 nm, such that the thickness of the leveling film over the recesses is 400 nm. Consequently, the resulting shifter undesirably has a cross-sectional configuration such as that shown in FIG. 6(a). Thus, the phase is disordered in the same light-transmitting region, and the phase angle cannot accurately be controlled.

As has been described above, in the conventional overlying shifter type phase shift photomask, the shifter material is influenced by the unevenness of the underlying light-blocking film patterns, so that the desired cross-sectional configuration cannot be obtained. Consequently, the phase is disordered in the same light-transmitting region of the shifter material, and the phase angle cannot accurately be controlled. Accordingly, it has been demanded to cope with these problems.

SUMMARY OF THE INVENTION

Under the above-described circumstances, an object of the present invention is to provide an overlying shifter type phase shift photomask of high quality which is capable of melting the demands for reduction in line width and increase in integration density of photomasks.

The present invention provides a method of producing an overlying shifter type phase shift photomask, which includes the steps of: forming at least a light-blocking layer pattern or a combination of a light-blocking layer pattern and an etching stopper layer for a shifter layer on a transparent substrate; forming a shifter layer over the whole surface of the transparent substrate where the light-blocking layer pattern has been formed; and patterning the shifter layer to form a shifter layer pattern. The method further includes the step of polishing away unevenness on the surface of the shifter layer caused by a step which is produced by the light-blocking layer pattern, thereby leveling the surface of the shifter layer.

In addition, the present invention provides a method of producing an overlying shifter type phase shift photomask, which includes the steps of: forming at least a light-blocking layer pattern or a combination of a light-blocking layer pattern and an etching stopper layer for a shifter layer on a transparent substrate; forming a leveling layer over the whole surface of the transparent substrate where the light-blocking layer pattern has been formed; forming a shifter layer over the whole surface of the leveling layer; and patterning the shifter layer to form a shifter layer pattern; or forming at least a light-blocking layer pattern on a transparent substrate; forming a leveling layer over the whole surface of the transparent substrate where the light-blocking layer pattern has been formed; forming an etching stopper layer for a shifter layer over the whole surface of the leveling layer; forming a shifter layer over the whole surface of the etching stopper layer; and patterning the shifter layer to form a shifter layer pattern. The method further includes the step of coating a layer for leveling over the whole surface of the transparent substrate where the light-blocking layer pattern has been formed, and then polishing away unevenness on the surface of the layer caused by a step which is produced by the light-blocking layer pattern, thereby leveling the surface of the layer to form the above-described leveling layer.

In addition, the present invention provides an overlying shifter type phase shift photomask producing method in which at least a light-blocking layer pattern or a combination of a light-blocking layer pattern and an etching stopper layer for a shifter layer is formed on a transparent substrate, and a leveling layer is formed over the whole surface of the transparent substrate where the light-blocking layer pattern has been formed, and then a shifter layer is formed over the whole surface of the leveling layer, and patterned to form a shifter layer pattern. In the method, after the shifter layer pattern has been formed, the leveling layer is processed into the same pattern as the shifter layer pattern.

In addition, the present invention provides a method of producing an overlying shifter type phase shift photomask blank, which includes the steps of: forming at least a light-blocking layer pattern or a combination of a light-blocking layer pattern and an etching stopper layer for a shifter layer on a transparent substrate; and forming a shifter layer over the whole surface of the transparent substrate where the light-blocking layer pattern has been formed. The method further includes the step of polishing away unevenness on the surface of the shifter layer caused by a step which is produced by the light-blocking layer pattern, thereby leveling the surface of the shifter layer.

In addition, the present invention provides a method of producing an overlying shifter type phase shift photomask blank, which includes the steps of: forming at least a light-blocking layer pattern or a combination of a light-blocking layer pattern and an etching stopper layer for a shifter layer on a transparent substrate; forming a leveling layer over the whole surface of the transparent substrate where the light-blocking layer pattern has been formed; and forming a shifter layer over the whole surface of the leveling layer; or forming at least a light-blocking layer pattern on a transparent substrate; forming a leveling layer over the whole surface of the transparent substrate where the light-blocking layer pattern has been formed; forming an etching stopper layer for a shifter layer over the whole surface of the leveling layer; and forming a shifter layer over the whole surface of the etching stopper layer. The method further includes the step of coating a layer for leveling over the whole surface of the transparent substrate where the light-blocking layer pattern has been formed, and then polishing away unevenness on the surface of the layer caused by a step which is produced by the light-blocking layer pattern, thereby leveling the surface of the layer to form the above-described leveling layer.

In addition, the present invention provides an overlying shifter type phase shift photomask having a transparent substrate, and at least a light-blocking layer pattern or a combination of a light-blocking layer pattern and an etching stopper layer for a shifter layer, which is provided on the transparent substrate. The photomask further has a shifter layer pattern which is provided over the light-blocking layer pattern. The shifter layer pattern has been leveled by polishing.

In addition, the present invention provides an overlying shifter type phase shift photomask having a transparent substrate, and at least a light-blocking layer pattern or a combination of a light-blocking layer pattern and an etching stopper layer for a shifter layer, which is provided on the transparent substrate. The photomask further has a leveling layer and a shifter layer pattern, which are successively stacked over the light-blocking layer pattern. Alternatively, the overlying shifter type phase shift photomask has a transparent substrate, a light-blocking layer pattern provided on the transparent substrate, a leveling layer provided over the light-blocking layer pattern, an etching stopper layer for a shifter layer provided on the leveling layer, and a shifter layer pattern provided on the etching stopper layer. In either of the overlying shifter type phase shift photomasks, the leveling layer has been leveled by polishing.

In addition, the present invention provides an overlying shifter type phase shift photomask in which at least a light-blocking layer pattern or a combination of a light-blocking layer pattern and an etching stopper layer for a shifter layer is provided on a transparent substrate, and a leveling layer and a shifter layer pattern are successively stacked over the light-blocking layer pattern. In the photomask, the leveling layer is processed into the same pattern as the shifter layer pattern, and the phase difference $\phi$ between exposure light passing through the stacked pattern which is formed from the leveling layer and the shifter layer and exposure light passing through a region where no stacked pattern is present falls within the following range:

$$m\pi - \pi/3 < \phi < m\pi + \pi/3$$

(m is an odd integer)

In addition, the present invention provides an overlying shifter type phase shift photomask blank having a transparent substrate, and at least a light-blocking layer pattern or a combination of a light-blocking layer pattern and an etching stopper layer for a shifter layer, which is provided on the transparent substrate. The photomask blank further has a shifter layer provided over the whole surface of the transparent substrate where the light-blocking layer pattern has been formed. The shifter layer has been leveled by polishing.

In addition, the present invention provides an overlying shifter type phase shift photomask blank having a transparent substrate, and at least a light-blocking layer pattern or a combination of a light-blocking layer pattern and an etching stopper layer for a shifter layer, which is provided on the transparent substrate. The photomask blank further has a leveling layer and a shifter layer, which are successively stacked over the light-blocking layer pattern. Alternatively, the overlying shifter type phase shift photomask blank has a transparent substrate, a light-blocking layer pattern provided on the transparent substrate, a leveling layer provided over the light-blocking layer pattern, an etching stopper layer for a shifter layer provided on the leveling layer, and a shifter layer provided on the etching stopper layer. In either of the photomask blanks, the leveling layer has been leveled by polishing.

In addition, the present invention provides an overlying shifter type phase shift photomask blank in which at least a light-blocking layer pattern or a combination of a light-blocking layer pattern and an etching stopper layer for a shifter layer is provided on a transparent substrate, and a leveling layer and a shifter layer are successively stacked over the light-blocking layer pattern. In the photomask blank, the phase difference $\phi$ between exposure light passing through the stack of the leveling layer and the shifter layer and exposure light passing through an air layer having the same optical path length as that of the stack falls within the following range:

$$m\pi - \pi/3 < \phi < m\pi + \pi/3$$

(m is an odd integer)

It should be noted that, in the method of producing an overlying shifter type phase shift photomask or an overlying shifter type phase shift photomask blank of the present invention, the leveling process is carried out by chemical mechanical polishing.

In the overlying shifter type phase shift photomask or overlying shifter type phase shift photomask blank of the present invention, the leveling process has been carried out by chemical mechanical polishing.

With the above-described arrangement of the overlying shifter type phase shift photomask according to the present invention, the shifter layer can be formed flat without being influenced by the step produced by the underlying light-blocking layer pattern. Therefore, the shifter layer thickness of the shifter pattern is uniform in the same light-transmitting region (opening). Thus, when projection exposure is carried out on a wafer, no phase disorder occurs within a light-transmitting region (opening).

Consequently, it is possible to provide an overlying shifter type phase shift photomask which is capable of accurately controlling the phase angle.

The overlying shifter type phase shift photomask blank of the present invention, arranged as described above, makes it possible to produce an overlying shifter type phase shift photomask which is capable of accurately controlling the phase angle.

The method for producing an overlying shifter type phase shift photomask of the present invention makes it possible to produce an overlying shifter type phase shift photomask which is capable of accurately controlling the phase angle.

The method for producing an overlying shifter type phase shift photomask blank of the present invention makes it possible to produce the above-described overlying shifter type phase shift photomask blank of the present invention.

More specifically, the production methods of claims 1 and 3 have a relatively small number of steps by virtue of the described arrangement. Consequently, these methods can be readily carried out. According to the production methods of claims 5 and 9, an etching stopper layer is provided on a leveling layer after the leveling layer has been formed. Therefore, even if the film thickness of the leveling layer is varied by polishing, the uniformity of the phase shift quantity is not impaired as long as the required flatness is maintained. Accordingly, the end point of polishing need not accurately be detected.

The photomask of claim 8 and the photomask blank of claim 11 have a relatively simple structure because no etching stopper layer is provided over the leveling layer.

Further, in the present invention, polishing is carried out by CMP (Chemical Mechanical Polishing). Therefore, the end point of polishing can be detected by monitoring the electric capacity, or monitoring the change of torque at the rotational driving part. Accordingly, the thickness can be controlled with high accuracy. In addition, it is possible to carry out polishing for leveling which is free from generation of particles.

Still other objects and advantages of the invention will be obvious and part apparent from the specification.

The invention accordingly comprises the features of construction, combinations of elements, and arrangement of parts which will be exemplified in the construction hereinafter set forth, and the scope of the invention will be indicated in the claims.

BRIEF DESCRIPTION OF THE DRAWINGS

FIG. 5(a) to 5(c) schematically shows the process for producing a conventional overlying shifter type phase shift photomask.

FIGS. 6(a) to 6(c) are sectional views showing cross-sectional configurations of shifter pattern regions of overlying shifter type phase shift photomasks.

DESCRIPTION OF THE PREFERRED EMBODIMENTS

EXAMPLE 1

Example 1 of the present invention will be described below with reference to FIGS. 1(a) to 1(e). FIGS. 1(a) to 1(e) are sectional views schematically showing the process of producing an overlying shifter type phase shift photomask for i-line exposure in Example 1 of the present invention.

Figure 1A:
FIGS. 1(a) to 1(e) are sectional views schematically showing the process of producing an overlying shifter type phase shift photomask in Example 1 according to the present invention.

As shown in FIG. 1(a), on a synthetic quartz substrate 101, a hafnium oxide film etching stopper layer 102 was formed to a thickness of 20 nm by sputtering under the following conditions:

System: RF magnetron sputter

Target: hafnium oxide

Gas and pressure: argon, 3Pa

Film formation rate: about 0.5 nm/min

On the hafnium oxide film 102, a light-blocking film was formed. The light-blocking film was composed of a chromium light-blocking film, and a low-reflection layer of a nitride oxide film disposed on each side of the chromium light-blocking film. The light-blocking film was selectively etched by a conventional lithography technique, thereby obtaining desired light-blocking film patterns 103, as shown in FIG. 1(a).

It should be noted that the light-blocking film forming condition and the lithography process for producing the light-blocking film patterns 103 were the same as those in the case of a conventional photomask comprising only a quartz substrate and a chromium light-blocking layer. The thickness of the light-blocking film patterns 103 was measured with a profilometer (Dektak 8000, by Sloan), and found to be about 120 nm.

Figure 1B:
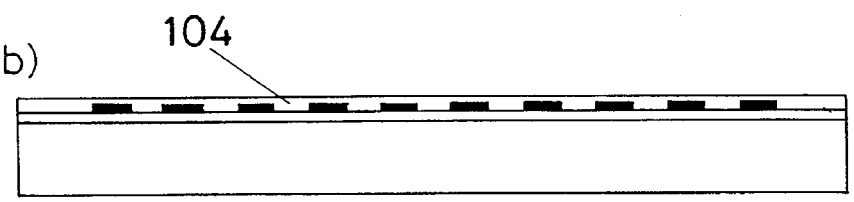

Next, as shown in FIG. 1(b), a commercially available SOG (Accuglass 211S, manufactured by Allied Signal) was coated over the light-blocking film patterns 103 by spin coating method and then fired for 1 hour at 300° C. in a nitrogen atmosphere, thereby obtaining an SOG film 104 having a film thickness of about 250 nm after the firing process.

Figure 1C:
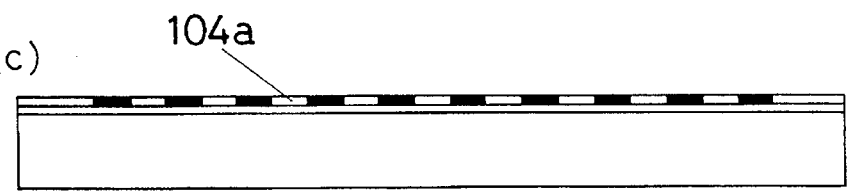
Figure 4:
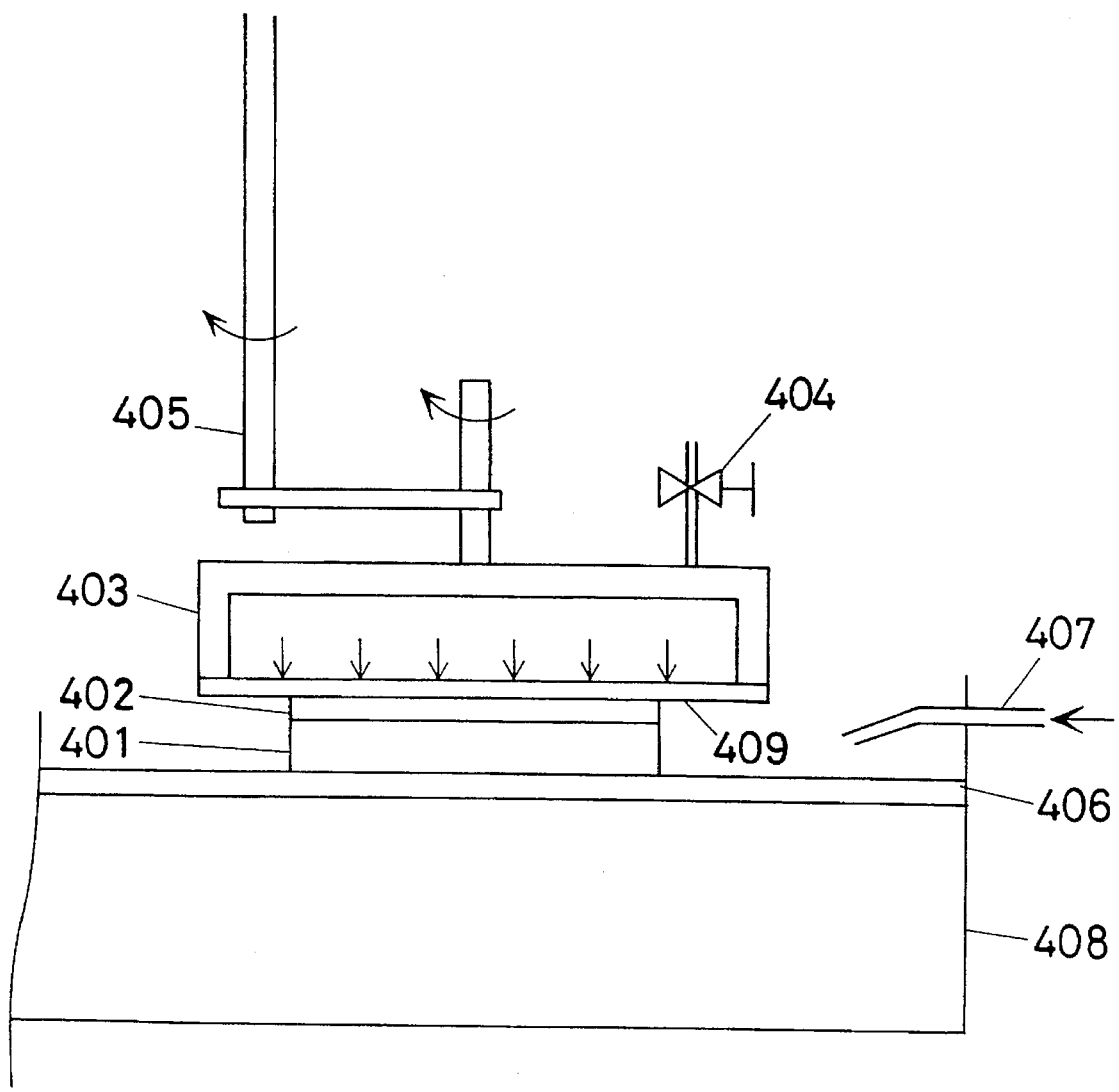
FIG. 4 shows a CMP apparatus employed in Examples of the present invention.
Figure 7A:
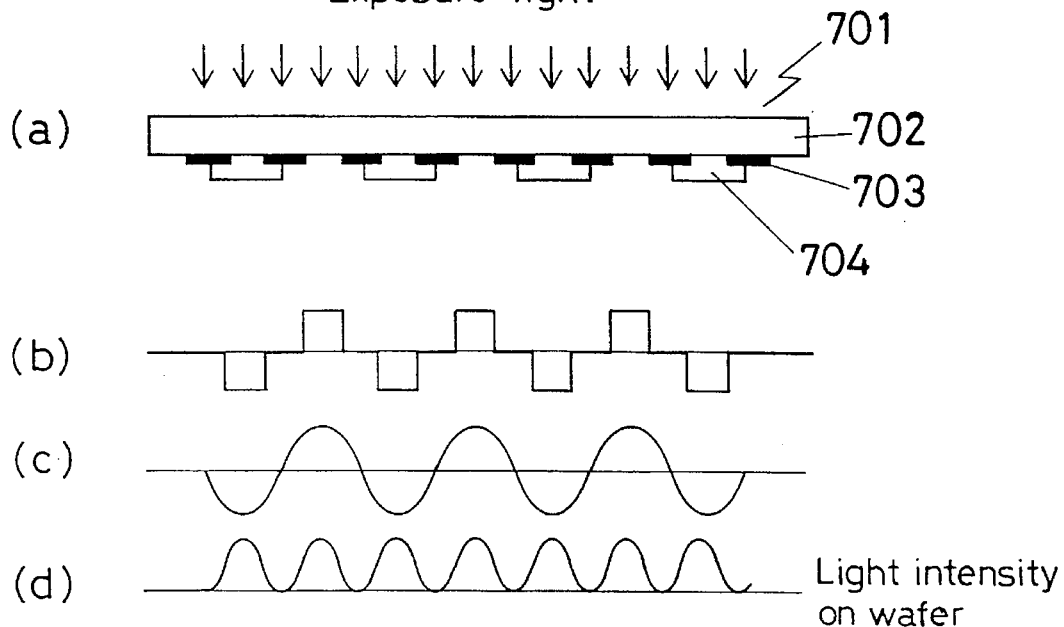
FIG. 7(A) is a view for explanation of resolution in a case where projection exposure is carried out on a wafer by using an overlying shifter type phase shift photomask.
Figure 7B:
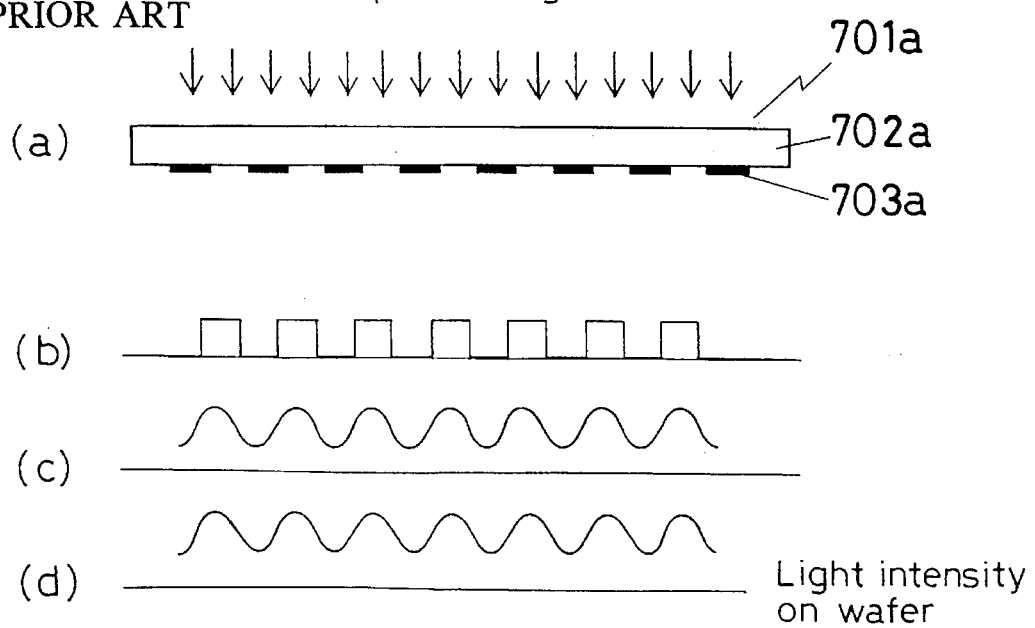
FIG. 7(B) is a view for explanation of resolution in a case where projection exposure is carried out on a wafer by using a conventional photomask.

Thereafter, as shown in FIG. 1(c), the SOG film 104 was polished by a CMP (Chemical Mechanical Polishing) apparatus, which is schematically shown in FIG. 4, until the light-blocking film patterns 103 came in contact with the polishing pad, thereby producing a flat SOG film 104a having a thickness of 120 nm in each opening in the light-blocking film.

The CMP apparatus shown in FIG. 4 will briefly be explained below.

In FIG. 4, a substrate 401 is attached to a substrate rotating carriage 403 by a substrate holder 402. The lower surface 409 of the substrate rotating carriage 403 is formed as a diaphragm. Thus, by introducing pressurized air into the inside of the substrate rotating carriage 403 through a valve 404, the substrate 401 can be pressed under uniform pressure against a polishing pad 406 which is fixed on a table 4.08. Further, a predetermined chemical liquid can be supplied to the substrate 401 through a tube 407 during polishing. The substrate rotating carriage 403 is subjected to an appropriate load by a support rod 405 and allowed to revolve on its own axis and around the axis of the support rod 405 over the pad 406, as shown in the figure. The end point of the polishing is detected by monitoring the electric capacity of the pad 406. In this way, the SOG films 104a are obtained.

It should be noted that the polishing end point detection may be carried out by using an end point detecting method in which the change of torque at the rotational driving part is monitored, in combination with the above-described method in which the pad electric capacity is monitored.

Figure 1D:
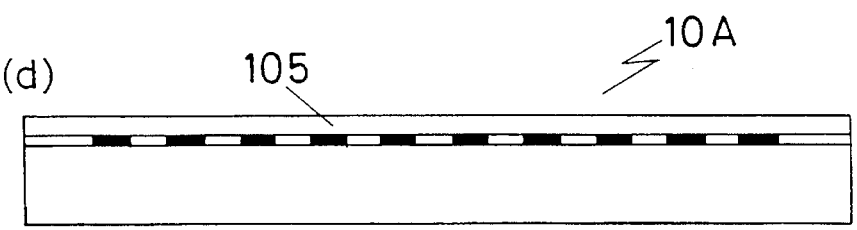

Meanwhile, the refractive index for the i-line (365 nm) of the SOG after the firing process was determined to be 1.45 by spectroellipsometry. Therefore, the film thickness required to invert the phase of exposure light was determined to be about 410 nm from Eq. (1). Accordingly, SOG was further coated over the SOG films 104a to a thickness of 290 nm and then fired, as shown in FIG. 1(d), thereby obtaining an overlying shifter type phase shift photomask blank 10A according to the present invention.

Unlike a conventional overlying shifter type phase shift photomask blank produced by a method including no polishing process, the blank obtained by the above-described method has a favorably flat surface.

Figure 1E:
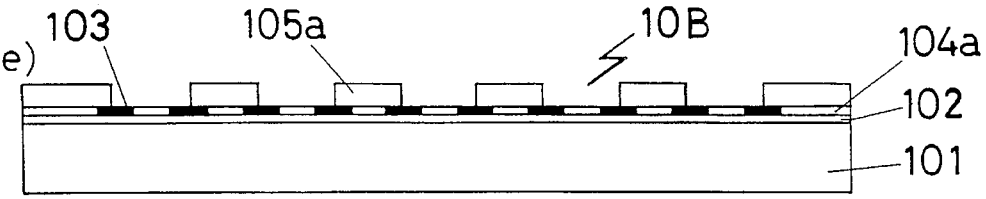

Further, as shown in FIG. 1(e), the SOG film of the blank was photoengraved by an ordinary lithography method, thereby forming shifter pattern regions 105a in desired patterns. Etching for forming the shifter pattern regions 105a of the SOG film was carried out by a dry etching process under the following conditions:

System: RF reactive ion etching

Gas and pressure: $CHF_3:O_2=10:1$, 5Pa

Power: 100 W

In this way, an overlying shifter type phase shift photomask 10B of the present invention was obtained, as shown in FIG. 1(e).

In the phase shift photomask 10B, the phase shift pattern regions 105a had a cross-sectional configuration such as that shown in FIG. 6(b), unlike the cross-sectional configuration shown in FIG. 6(a) as seen in the case of an overlying shifter type phase shift photomask produced by the conventional method as shown in FIG. 5. There was no nonuniformity in the phase shift film thickness distribution in the same opening; the film thickness of the SOG shifter was uniform.

In Example 1, a shifter layer is formed from the polished SOG film 104a and the patterned SOG film 105a. In this case, the polished SOG film 104a serves as a leveling layer.

Although in this example the SOG film 104a, which serves as a leveling layer, and the SOG film 105a are formed of the same material, the shifter layer may be formed by using a combination of different materials.

In this example, the hafnium oxide film 102, which serves as an etching stopper layer, may be formed over the whole surface of the mask after the light-blocking film patterns 103 have been formed on the synthetic quartz substrate 101.

The reason why the thickness of the polished SOG film 104a is set equal to that of the light-blocking layer 103 in this example is that, during the polishing process by the CMP apparatus, the film thickness can be even more reliably controlled by the contact of the light-blocking film patterns with the polishing pad.

It should be noted that resolution is effectively improved when projection exposure is carried out on the wafer, provided that the phase difference φ between exposure light passing through the stacked patterns formed from the two layers, i.e. the SOG film 104a as a leveling layer, and the SOG film 105a, and exposure light passing through regions where no stacked patterns are present falls within the following range:

$$m\pi - \pi/3 < \phi < m\pi + \pi/3$$

(m is an odd integer)

Although hafnium oxide ($HfO_2$) was used as an example of a material for the etching stopper layer, and SOG was used as an example of a material for the leveling and shifter layers, it is possible to use other materials.

EXAMPLE 2

Example 2 of the present invention will be explained below with reference to FIGS. 2(a) to 2(d). FIGS. 2(a) to 2(d) are sectional views schematically showing the process of producing an overlying shifter type phase shift photomask for i-line exposure in Example 2 of the present invention.

Figure 2A:
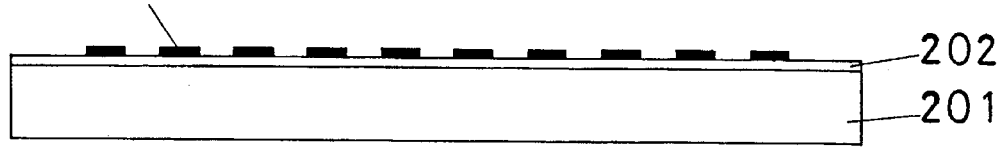
FIGS. 2(a) to 2(d) are sectional views schematically showing the process of producing an overlying shifter type phase shift photomask in Example 2 according to the present invention.
Figure 2B:
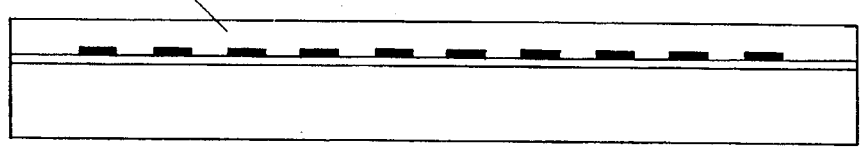

As shown in FIG. 2(a), on a synthetic quartz substrate 201, a hafnium oxide film 202 was formed to a thickness of 20 nm by sputtering, and light-blocking film patterns 203 were formed on the hafnium oxide film 202, in the same way as in Example 1. The light-blocking film patterns 203 were formed from a chromium light-blocking film having a low-reflection layer of a nitride oxide film disposed on each side thereof. Thereafter, as shown in FIG. 2(b), an SOG film 204 was formed over the light-blocking film patterns 203 so that the SOG film 204 had a film thickness of about 560 nm after the firing process.

Figure 2C:
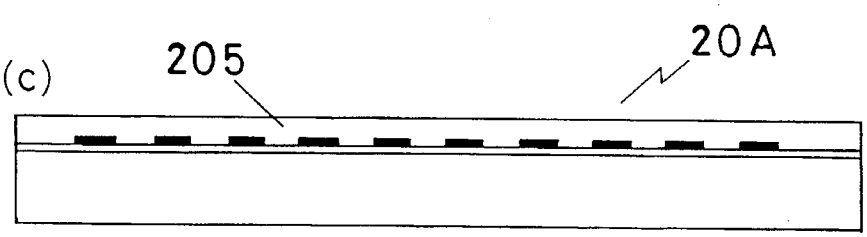

Next, as shown in FIG. 2(c), the SOG film 204 was leveled by using the same CMP (Chemical Mechanical Polishing) apparatus as that used in Example 1, thereby producing a leveling layer 205 of SOG film having a thickness of 410 nm, and thus forming an overlying shifter type phase shift photomask blank 20A.

Figure 2D:
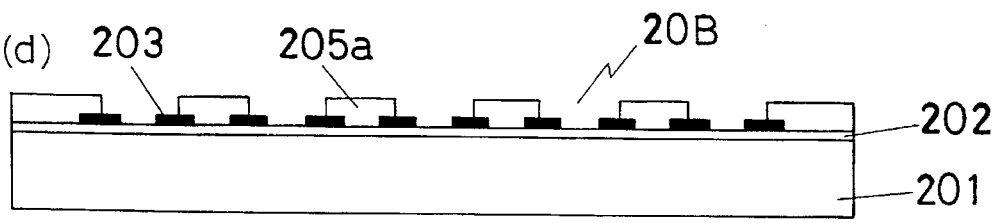

Next, the SOG film 205 of the overlying shifter type phase shift photomask blank 20A was photoengraved in the same way as in Example 1, thereby forming shifter pattern regions 205a in desired patterns, and thus obtaining an overlying shifter type phase shift photomask 20B of the present invention, as shown in FIG. 2(d).

In the phase shift photomask 20B, the shifter pattern regions 205a had a favorably flat surface, and there was no nonuniformity in the phase shift film thickness distribution in the same opening as seen in the conventional overlying shifter type phase shift photomask. Thus, the film thickness of the SOG shifter was uniform. In this example, the hafnium oxide film 202, which serves as an etching stopper layer, may be formed over the whole surface of the mask after the light-blocking film patterns 203 have been formed on the synthetic quartz substrate 201. Although hafnium oxide ($HfO_2$) was used as an example of a material for the etching stopper layer, and SOG was used as an example of a material for the leveling and shifter layers, it is possible to use other materials.

EXAMPLE 3

Example 3 of the present invention will be explained below with reference to FIGS. 3(a) to 3(f). FIGS. 3(a) to 3(f) are sectional views schematically showing the process of producing an overlying shifter type phase shift photomask for i-line exposure in Example 3 of the present invention.

Figure 3A:
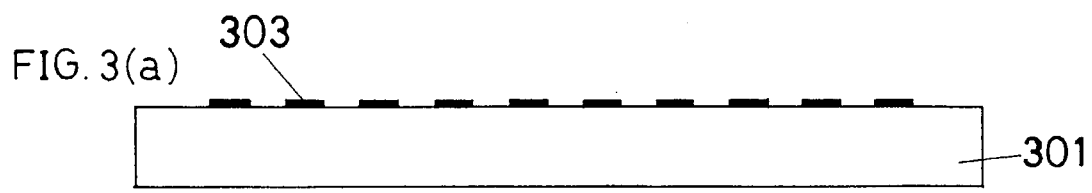
FIGS. 3(a) to 3(f) are sectional views schematically showing the process of producing an overlying shifter type phase shift photomask in Example 3 according to the present invention.
Figure 3B:
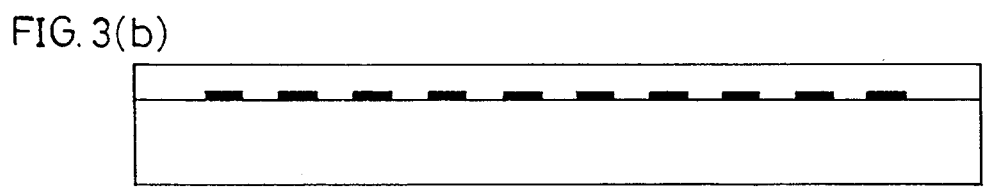

As shown in FIG. 3(a), on a synthetic quartz substrate 301 for photomask, light-blocking film patterns 303 were formed, in the same way as in Example 1. The light-blocking film patterns 303 were formed from a chromium light-blocking film having a low-reflection layer of a nitride oxide film disposed on each side thereof. Thereafter, as shown in FIG. 3(b), an SOG film was formed over the light-blocking film patterns 303 so that the SOG film had a film thickness of about 350 nm after the firing process.

Figure 3C:
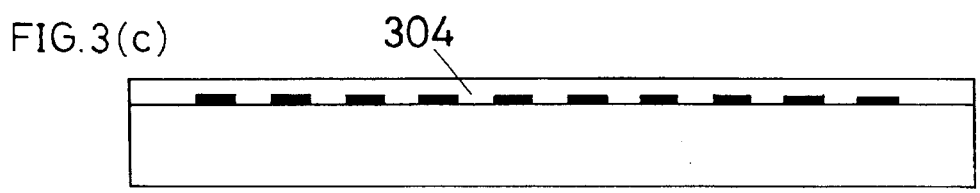

Next, as shown in FIG. 3(c), the SOG film was leveled by using the same CMP (Chemical Mechanical Polishing) apparatus as that used in Example 1, thereby producing a leveling layer 304 of SOG film having a thickness of 250 nm.

Figure 3D:
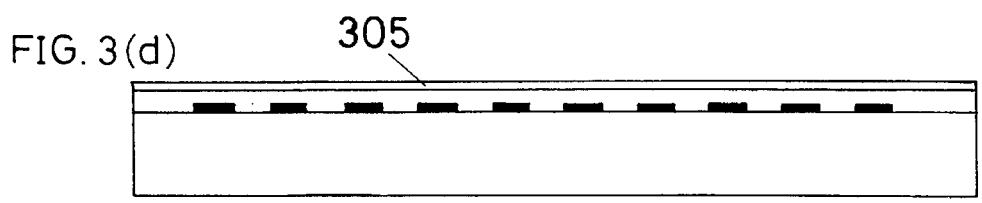

Next, as shown in FIG. 3(d), an etching stopper layer 305 of hafnium oxide was provided to a thickness of 20 nm on the leveling lever 304. The etching stopper layer 305 was formed by the same method under the same conditions as in Example 1.

Figure 3E:
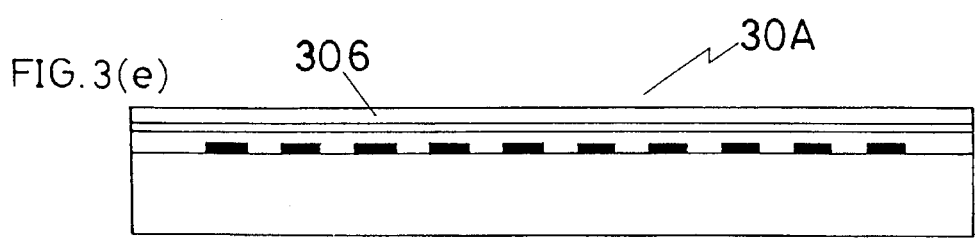

As shown in FIG. 3(e), an SOG film was coated on the etching stopper layer 305 and then fired in the same way as the above, thereby forming a shifter layer 306 of SOG having a thickness of 410 nm, and thus obtaining an overlying shifter type phase shift photomask blank 30A.

Figure 3F:
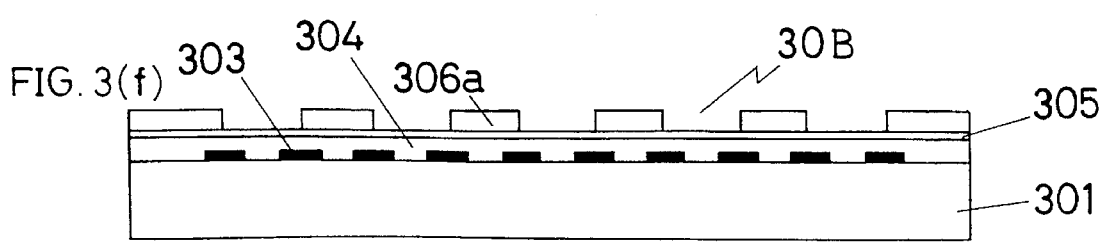

Next, the SOG film 306 of the overlying shifter type phase shift photomask blank 30A was photoengraved in desired patterns 306a in the same way as in Example 1, thereby obtaining an overlying shifter type phase shift photomask 30B of the present invention, as shown in FIG. 3(f).

Although hafnium oxide (HfO$_2$) was used as an example of a material for the etching stopper layer, and SOG was used as an example of a material for the leveling and shifter layers, it is possible to use other materials.

In this phase shift photomask also, the SOG shifter regions 306a have a favorably flat surface, and there was no nonuniformity in the phase shift film thickness distribution within an opening as seen in the conventional overlying shifter type phase shift photomask. Thus, the film thickness of the SOG shifter was uniform, so that there was no phase disorder when projection exposure was carried out on the wafer.

The overlying shifter type phase shift photomask and blank of the present invention, together with the methods of producing the photomask and blank according to the present invention, make it possible to provide an overlying shifter type phase shift photomask which is capable of coping with demands for reduction in line width and increase in integration density of LSI, VLSI, ULSI, etc.

More specifically, the present invention makes it possible to provide an overlying shifter type phase shift photomask which is capable of accurately controlling the phase angle and of transferring fine-line patterns to a wafer.

What is claimed is:

1. A method of producing a phase shift photomask, said method comprising the steps of:

forming one of: a light-blocking pattern and a combination of a light-blocking pattern and an etching stopper layer on a substrate;

forming a shifter layer over said light-blocking pattern, said shifter layer filling openings in said light-blocking pattern polishing away unevenness on an upper surface of said shifter layer, thereby leveling the surface of said shifter layer; and patterning said shifter layer to form a shifter pattern.

2. A phase shift photomask comprising:

a substrate;

at least one of a light-blocking pattern and a combination of a light-blocking pattern and an etching stopper layer, which is provided on said substrate; and a shifter pattern provided over said light blocking pattern and openings of said light-blocking pattern, wherein upper surfaces of components of said shifter pattern have been leveled by polishing.

3. A method of producing a phase shift photomask blank, said method comprising the steps of:

forming at least one of: a light-blocking pattern and a combination of a light-blocking pattern and an etching stopper layer on a substrate; and forming a shifter layer over said light-blocking pattern said shifter layer filling openings in said light-blocking pattern; and polishing away unevenness on an upper surface of said shifter layer thereby leveling the surface of said shifter layer.

4. A phase shift photomask blank comprising:

a transparent substrate;

at least one of: a light-blocking pattern and a combination of a light-blocking pattern and an etching stopper layer, which is provided on said substrate; and a shifter layer provided over said light-blocking pattern, wherein said shifter layer fills openings in said light-blocking pattern;

wherein said shifter layer has an upper surface leveled by polishing.

5. A method of producing a phase shift photomask, said method comprising the steps of:

forming at least one of: a light-blocking pattern and a combination of a light-blocking pattern and an etching stopper layer on a substrate;

forming a leveling layer over said light-blocking pattern, wherein said leveling layer fills openings in said light-blocking pattern;

polishing away unevenness on an upper surface of said leveling layer, thereby leveling the surface of said layer;

forming a shifter layer over said leveling layer; and patterning said shifter layer to form a shifter pattern.

6. A method for producing a phase shift photomask according to claim 5, wherein, said leveling layer is processed into the same pattern as said shifter pattern.

7. A phase shift photomask comprising:

a substrate;

at least one of: a light-blocking pattern layer and a combination of a light-blocking pattern layer and an etching stopper layer, which is provided on said substrate; and a leveling layer, wherein said leveling layer has been leveled by polishing; and a shifter pattern layer, wherein said layers are successively stacked on said substrate.

8. A photomask according to claim 7, wherein said leveling layer is processed into the same pattern as said shifter pattern layer, and wherein a phase different $\phi$ between a) exposure light passing through a stack comprising said leveling layer and said shifter pattern layer and b) exposure light passing through a region where no stack is present falls within the following range:

$$m\pi - \pi/3 < \phi < m\pi + \pi/3$$

(m is an odd integer).

9. A method of producing a phase shift photomask blank, said method comprising the steps of:

forming at least one of: a light-blocking pattern layer and a combination of a light-blocking pattern layer and an etching stopper layer on a substrate;

forming a leveling layer over said light-blocking pattern layer, wherein said leveling layer fills openings in said light-blocking pattern layer; polishing away unevenness on an upper surface of said leveling layer thereby leveling the surface of said layer to form said leveling layer; and forming a shifter layer over said leveling layer.

10. A phase shift photomask blank comprising:

a substrate;

at least one of: a light-blocking pattern layer and a combination of a light-blocking pattern layer and an etching stopper layer which is provided on said substrate; and a leveling layer, wherein said leveling layer has been leveled by polishing; and a shifter layer, wherein said layers are successively stacked over said substrate.

11. A phase shift photomask blank according to claim 10, comprising:

wherein a phase difference φ between a) exposure light passing through a stack comprised of said leveling layer and said shifter layer and b) exposure light passing through an air layer having the same optical path length as that of said stack falls within the following range:

$$m\pi - \pi/3 < \phi < m\pi/3$$

(m is an odd integer).

12. A method of producing a phase shift photomask, said method comprising the steps of:

forming a light-blocking pattern layer on a substrate;

forming a leveling layer over said light-blocking pattern layer wherein said leveling layer fills openings in said light blocking pattern layer;

forming an etching stopper layer over said leveling layer;

polishing away unevenness on a surface of said leveling layer, thereby leveling the surface of said layer;

forming a shifter layer over said etching stopper layer; and patterning said shifter layer to form a shifter pattern.

13. A phase shift photomask comprising:

a substrate;

a light-blocking pattern layer provided on said substrate, a leveling layer provided over said light-blocking pattern layer, said leveling layer having been leveled by polishing;

an etching stopper layer provided on said leveling layer; and a shifter pattern layer provided on said etching stopper layer.

14. A method of producing a phase shift photomask blank comprising the steps of:

forming a light-blocking pattern layer on a substrate;

forming a leveling layer over said light-blocking pattern layer;

forming an etching stopper layer over said leveling layer;

polishing away unevenness on an upper surface of said leveling layer, thereby leveling the surface of said layer; and forming a shifter layer over said etching stopper layer.

15. A method of producing a phase shift photomask or a phase shift photomask blank according to any one of claims 1, 3, 5, 9, 6, 12, or 14 wherein said polishing comprises chemical mechanical polishing.

16. A phase shift photomask blank comprising:

a substrate;

a light-blocking pattern layer provided on said substrate;

a leveling layer provided over said light-blocking pattern layer, wherein said leveling layer has been leveled by polishing;

an etching stopper layer for a shifter layer provided on said leveling layer.

17. A phase shift photomask or a phase shift photomask blank according to any one of claims 2, 4, 7, 10, 8, 11, 13, or 16 wherein said polishing comprises chemical mechanical polishing.

18. A phase shift photomask comprising:

a substrate;

at least one of: a light-blocking pattern layer and a combination of a light-blocking pattern layer and an etching stopping layer formed on said substrate;

a shifter pattern layer formed over said light-blocking pattern layer, wherein portions of said shifter pattern layer that coincide with openings of said light blocking layer have substantially uniform thicknesses.

* * * * *